United States Patent [19]

Nasser et al.

[11] Patent Number: 5,262,345
[45] Date of Patent: Nov. 16, 1993

[54] COMPLIMENTARY BIPOLAR/CMOS FABRICATION METHOD

[75] Inventors: Mohammad S. Nasser, San Jose; Saurabh M. Desai, Fremont; Derek F. Bowers, San Jose, all of Calif.

[73] Assignee: Analog Devices, Inc., Norwood, Mass.

[21] Appl. No.: 883,931

[22] Filed: May 15, 1992

Related U.S. Application Data

[60] Continuation-in-part of Ser. No. 655,761, Feb. 14, 1991, abandoned, which is a division of Ser. No. 470,160, Jan. 25, 1990, abandoned.

[51] Int. Cl.⁵ .................. H01L 21/70; H01L 27/00
[52] U.S. Cl. .................. 437/59; 148/DIG. 9
[58] Field of Search ............ 437/59; 148/DIG. 9

[56] References Cited

U.S. PATENT DOCUMENTS

| | | | |
|---|---|---|---|
| 4,637,125 | 1/1987 | Iwasaki et al. | 29/571 |
| 4,721,684 | 1/1988 | Musumeci | 437/30 |
| 4,927,776 | 5/1990 | Soejima | 437/33 |
| 4,954,456 | 9/1990 | Kim | 437/31 |
| 5,001,073 | 3/1991 | Huie | 437/31 |
| 5,001,076 | 3/1991 | Huie | 148/DIG. 9 |

OTHER PUBLICATIONS

Grebene, Alan B. "Bipolar and MOS Analog Integrated Circuit Design", A Wiley-Interscience Publication, John Wiley & Sons (1984), pp. 206-209.

*Primary Examiner*—Olik Chaudhuri
*Assistant Examiner*—Long Pham
*Attorney, Agent, or Firm*—Koppel & Jacobs

[57] ABSTRACT

A complementary bipolar process enables both PNP and NPN transistors to be added to a CMOS process with a minimum of extra fabrication steps. The P-well of a CMOS process is used for the collector region of the PNP transistor and the "down isolation" for the NPN transistor. A buried P diffusion provides "up" isolation for the NPN transistor and buried collector for the PNP transistor. A method for increasing the NPN buried collector to "up" isolation breakdown voltage is described which uses multiple N type impurities.

4 Claims, 5 Drawing Sheets

COMPLIMENTARY BIPOLAR/CMOS FABRICATION METHOD

This is a continuation-in-part of copending application Ser. No. 07/655,761, filed on Feb. 14, 1991, which in turn is a divisional of Ser. No. 07/470,160, filed on Jan. 25, 1990, both now abandoned.

BACKGROUND OF THE INVENTION

1. Field of the Invention

This invention relates to semiconductor devices, and more particularly to apparatus and method for manufacturing complementary bipolar transistor structures.

2. Description of the Related Art

Conventional bipolar integrated circuit processes are typically based around the production of an NPN bipolar transistor structure such as that depicted in FIG. 1. In FIG. 1, a P-type substrate 10 has a N-type buried layer 12 in its upper surface. An N− epitaxial layer 14 is grown over substrate 10 and buried layer 12. P+ well regions 16 and 18 set in the upper surface of epitaxial layer 14 are used to create spaced-apart P− vertical isolation regions by downward diffusion when the device is heated. An N+ emitter region 24, a P+ base 26, and an N+ collector region 28 are created in the upper surface of epitaxial layer 14 using conventional techniques. Metal contacts 30, 32 and 34 are created for emitter 24, base 26, and collector 28 respectively. A negative voltage is applied to metal contact 36 to create a negative potential in vertical isolation regions 22 and 20, and substrate 10. An oxide layer 38 is then formed over the entire device, and thereafter a protective insulating layer 40 is formed.

Although the conventional fabrication technique used to manufacture the NPN transistor depicted in FIG. 1 has also been used to manufacture a lateral PNP bipolar transistor on the same wafer, the performance of the PNP transistor so made is poor compared to that of the NPN transistor.

Several processes have been developed to produce a high quality PNP bipolar transistor and NPN bipolar transistor on the same wafer wherein the PNP transistor is created using a sequence of process steps similar to that used in fabricating the NPN transistor. One prior art approach is depicted in FIG. 2. In FIG. 2, the NPN transistor's components have been given the same numerical labels as corresponding components in FIG. 1 since they have similar functions.

Regarding the PNP transistor shown on the left-hand side of FIG. 2, an N well region 42 is created to isolate the P+ tub isolation region 44 from substrate 10. N− epitaxial layer 14 is then grown over substrate 10, well 42, and P+ isolation region 44.

Next, P+ well regions 46 and 48 are set in the upper surface of epitaxial layer 14. When the device is heated, dopant ions from well regions 46 and 48 downwardly diffuse and meet with upwardly diffused ions from P+ tub isolation region 44 to create P− down isolation region 50. P+ well region 48 also serves as the collector for the PNP transistor.

The P+ emitter 52 and N+ base 54 are set in the upper surface of epitaxial layer 14 using a conventional technique such as ion implantation. Emitter contact 56, base contact 58, and collector contact 60 are deposited through windows in oxide layer 38 so that they contact emitter 52, base 54, and collector 48 respectively. The protective insulation layer 40 is then formed over the entire device.

Although the complementary bipolar transistor structure depicted in FIG. 2 achieves acceptable results, it requires four extra mask steps than are required over a standard bipolar process such as that depicted in FIG. 1.

The desirability of producing low-power digital circuitry to be used in conjunction with high performance analog circuitry has led to the incorporation of Bipolar transistors and Complementary Metal Oxide Semiconductor (CMOS) devices on the same wafer. In general, these "BiCMOS" fabrication techniques enable only one type of bipolar transistor to be fabricated on the same wafer as the CMOS device due to the complexity of adding both NPN and PNP bipolar transistors to an already complicated CMOS process, and due to the relatively large number of extra mask steps required to fabricate such a fully complementary BiCMOS device.

SUMMARY OF THE INVENTION

It is a feature and advantage of the present invention to provide a technique for manufacturing complementary bipolar transistors using a CMOS compatible process.

It is another feature and advantage of the present invention to provide a technique for manufacturing high performance complementary bipolar transistors using a minimum number of masking steps.

It is yet another feature and advantage of the present invention to provide a technique for fabricating low power digital circuitry and high performance analog circuitry on the same wafer using the same processing steps.

These and other features and advantages are accomplished in a technique for fabricating fully complementary bipolar transistors using a CMOS process and diffusion isolation.

In accordance with the present invention, complementary bipolar transistors are fabricated using the following technique. Initially, first and second tub isolation regions are created that extend into the upper surface of a substrate. The substrate is doped to a first polarity, and the first and second tub isolation regions are doped to second polarity. A buried layer doped to the first polarity is formed in the upper surface of the second isolation region. The buried layer is preferably doped with at least two types of dopant ions having different rates of diffusion. An epitaxial layer doped to the first polarity is then formed over the substrate, the first and second tub isolation regions, and the buried layer.

A first well region is then formed in the upper surface of the epitaxial layer and above the first tub isolation region. This well region is used to isolate one of the bipolar transistors. Also, second and third spaced-apart well regions are formed in the upper surface of the epitaxial layer above the second tub isolation region. The second and third well regions are used to isolate the second bipolar transistor.

The entire device is then heated to diffuse dopant ions from the first, second and third well regions downwardly, and from the first and second isolation tubs upwardly, into the epitaxial layer. During this diffusion step, upwardly diffused dopant ions from the first tub isolation region meet downwardly diffusing dopant ions from the first well region to create a down isolation region, and downwardly diffusing dopant ions from the second and third well regions meet upwardly diffusing dopant ions from the second tub region to create spaced-apart vertical isolation regions which isolate the second transistor. The emitter, base, and collector regions for the respective transistors, along with their corresponding metal contacts, are created using a conventional technique such as implantation. A metal contact is also created for one of the vertical isolation regions so that a negative potential may be applied thereto. A positive potential is applied to the substrate.

During the above-described thermal diffusion step, dopant ions from the buried layer diffuse in lateral, downward and upward directions. This diffusion causes a graded region of the second polarity to form between the buried layer and the second tub isolation region. At the same time, dopants from the buried layer which have a faster rate of diffusion diffuse upward to counter-dope the portion of the second tub isolation region being formed above the buried layer. This counter-doping prevents the buried layer from being insulated from the epitaxial layer. In a preferred embodiment, the two type of dopant ions used to dope the buried layer are arsenic and phosphorous.

These and other features and advantages of the present invention will be apparent to those skilled in the art from the following detailed description of a preferred embodiment and the drawings, in which:

DETAILED DESCRIPTION OF THE INVENTION

Figure 6:
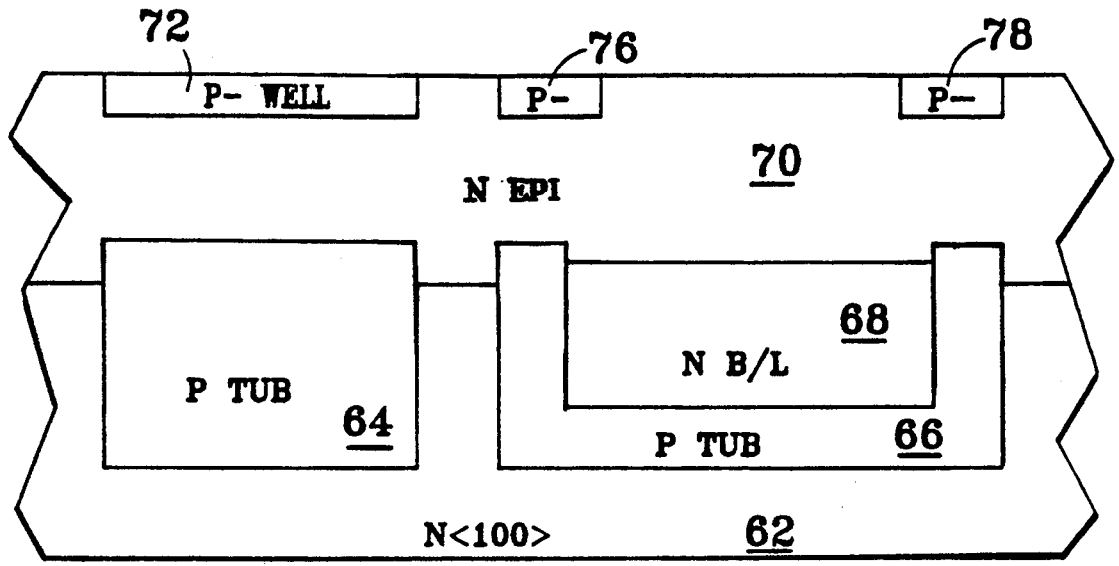
FIG. 6 is a sectional view of the structure of FIG. 5 at a later stage in the fabrication process, in which three well regions have been formed in the upper surface of the epitaxial layer.
Figure 7:
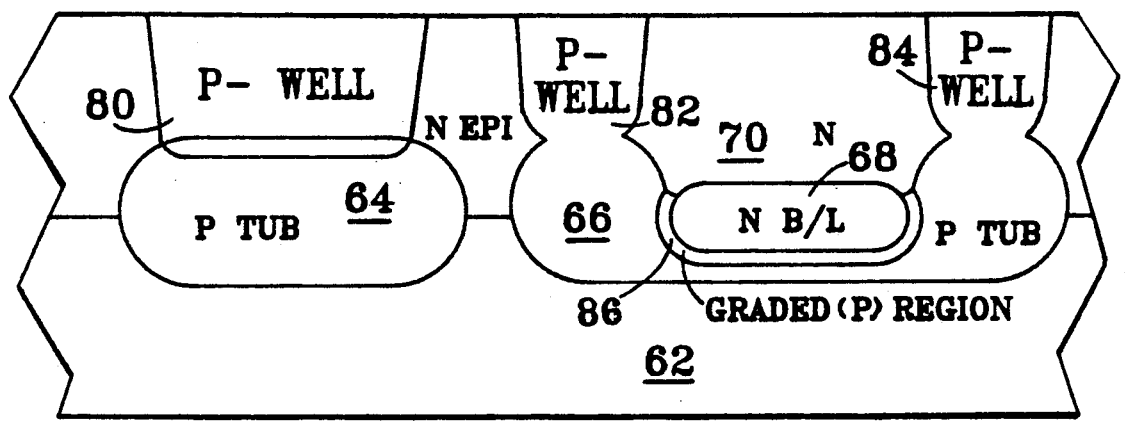
FIG. 7 is a sectional view of the structure of FIG. 6 at a later stage in the fabrication process, in which isolation regions have been driven in during a common thermal diffusion step.
Figure 8:
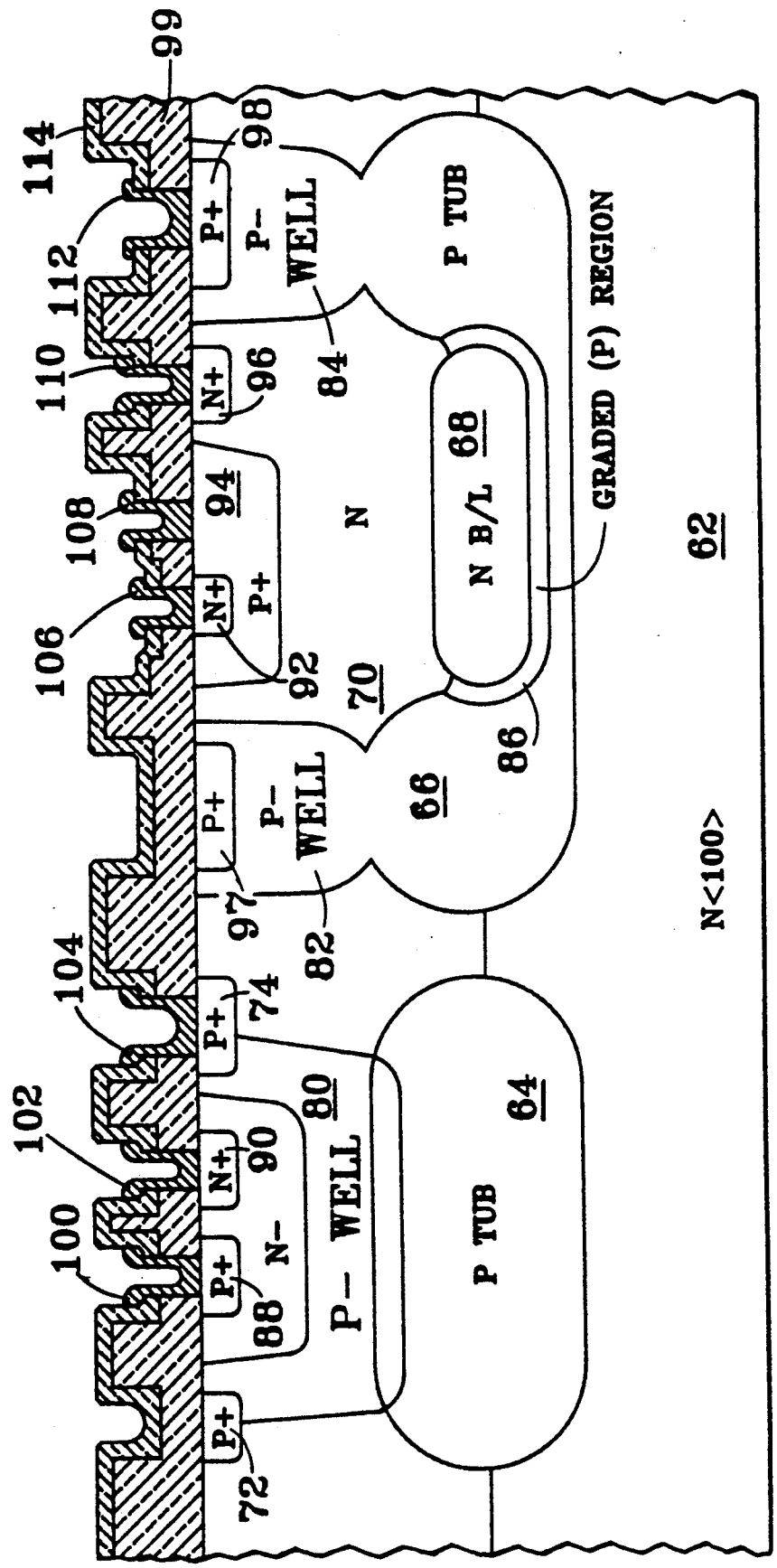
FIG. 8 is a sectional view of the structure of FIG. 7 at a later stage in the fabrication process depicting the preferred embodiment of the invention.

FIGS. 3 through 8 are sectional views in chronological order of the device during stages in the fabrication process. FIG. 8 is the resulting complementary bipolar transistor structure. In FIGS. 3 through 8, components having corresponding functions have been assigned the same numerical designations.

Figure 1:
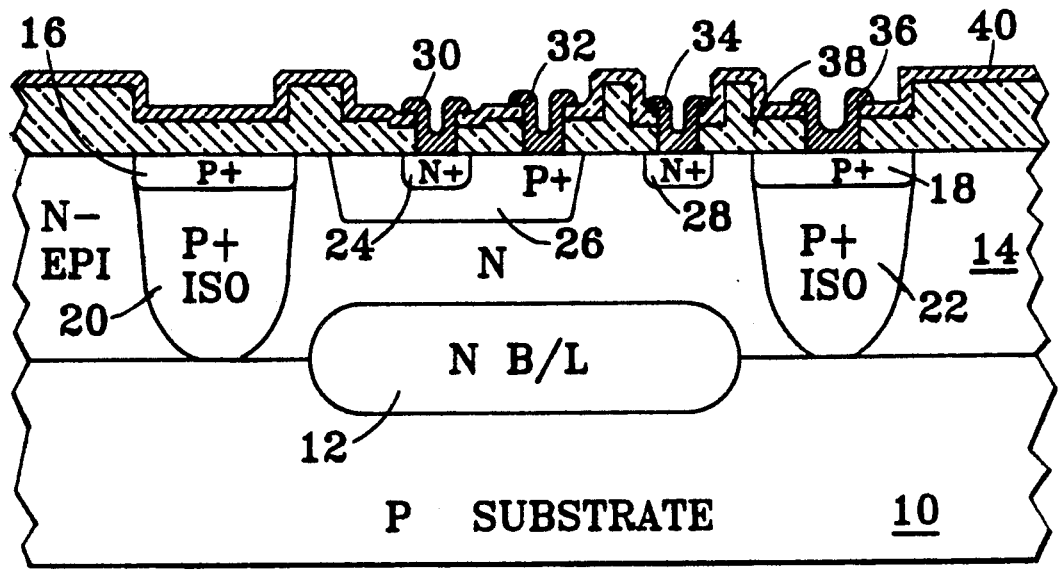
FIG. 1 is a sectional view of a prior art NPN bipolar transistor.
Figure 2:
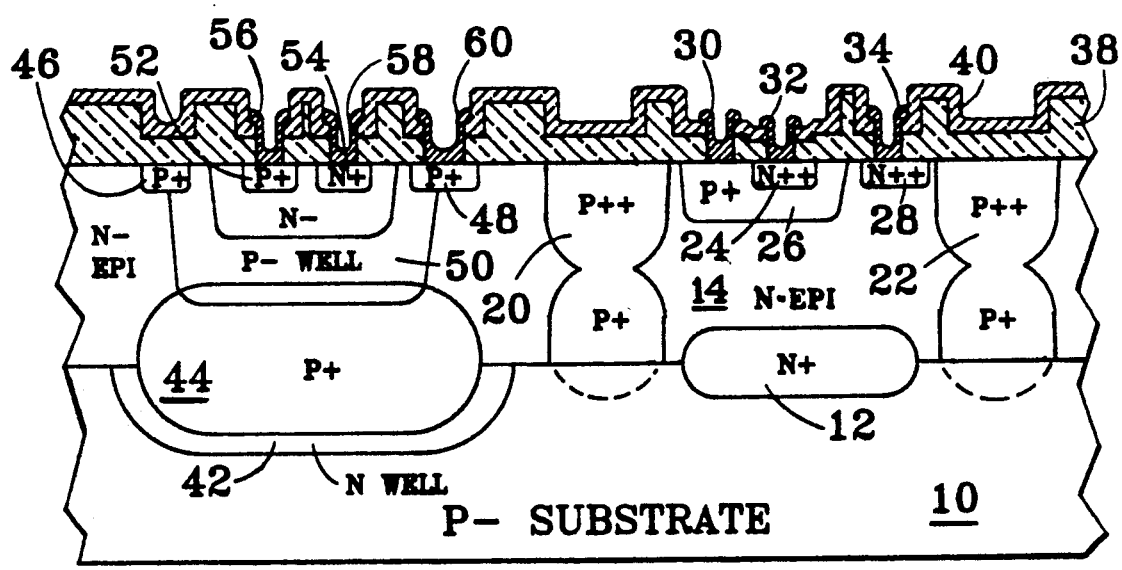
FIG. 2 is a sectional view of a prior art complementary bipolar transistor structure.
Figure 3:
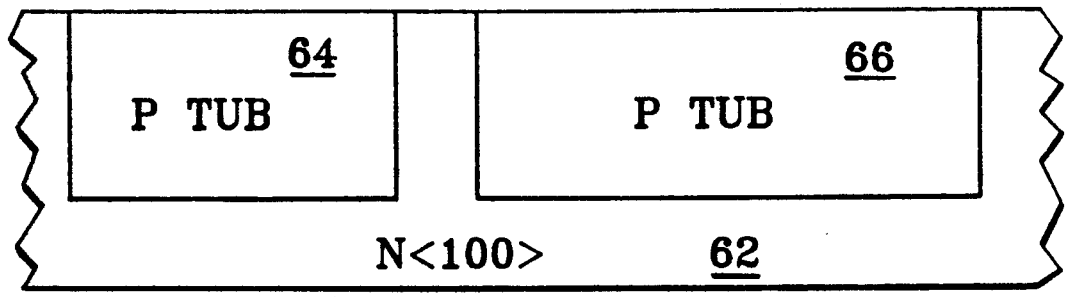
FIG. 3 is a sectional view of the starting substrate for the complementary bipolar transistor structure formed in accordance with the invention, with doped first and second tub isolation regions set in the substrate.

FIG. 3 depicts an initial step in the fabrication process. In FIG. 3, an N<100> silicon substrate 62 has first and second P tub isolation regions 64 and 66 respectively formed in its upper surface. The use of an N-type substrate enables the present invention to be manufactured using a CMOS process, since CMOS processes typically use an N-type substrate. The prior art devices depicted in FIGS. 1 and 2 use P-type substrates. Although a <100> orientation is preferable for N substrate 62, other orientations may be used.

First and second tub isolation regions 64 and 66 respectively are preferably formed by growing an oxide layer (not shown) on the substrate and using a conventional masking step to define regions 64 and 66 for implantation. As more clearly described below, first tub isolation region 64 acts as the buried layer for the resulting PNP transistor, whereas second tub isolation region 66 is used to isolate the NPN transistor from the N-type substrate 62. P-tub regions 64 and 66 are first implanted or chemically deposited with an initial dopant concentration at the surface on the order of $10^{16}$–$10^{17}$ boron ions per cubic centimeter.

Figure 4:
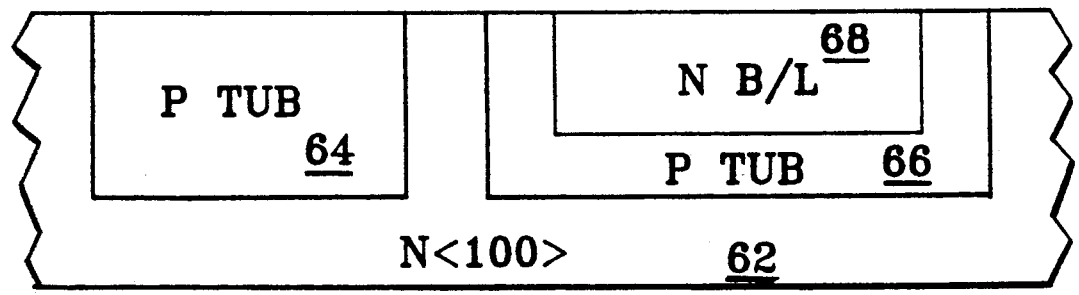
FIG. 4 is a sectional view of the structure of FIG. 3 at a later stage of fabrication, in which a buried layer has been formed over the second tub isolation region.

In the next fabrication step depicted in FIG. 4, an N-type buried layer 68 is created for the NPN transistor in the upper surface of second tub isolation region 66. Buried layer 68 is created using a conventional masking step and by implanting at least two types of N-type dopant ions into buried layer 68 having different rates of diffusion, such as arsenic or antimony and phosphorous.

The concentrations and types of N dopants are important aspects of the present invention. Regarding the concentration, if a heavy N-type concentration is used, premature breakdown between buried layer 68 and second tub isolation region 66 will occur. Conversely, if too light an N-type concentration is used the lateral impedance of the buried layer will be too high to produce a reasonably low value of NPN collector resistance.

The choice of dopants for buried layer 68 is also important. If phosphorous alone is used in the normal concentration, upward diffusion of the phosphorous during the subsequent thermal diffusion isolation step discussed below will result in a very low collector-base breakdown voltage. If arsenic or antimony alone is used as the N-type dopant, the P dopant ions from region 66 will diffuse right through buried layer 68 during the thermal isolation diffusion step, causing buried layer 68 to be totally insulated from the collector of the NPN transistor. That is, a P-film would be formed above the N-type buried layer 68. The presence of the P-film may cause a very high collector resistance or even base-to-isolation shorts in the NPN transistor.

The above problems are solved by the present invention, in which two types of dopant ions are used in buried layer 68. In a preferred embodiment, arsenic or antimony ions are implanted at a relatively high initial heavy dose, on the order of $10^{18}$–$10^{19}$ ions per cubic centimeter. At the same time, phosphorous ions are implanted at a relatively light initial concentration, on the order of $5 \times 10^{15}$–$5 \times 10^{16}$ ions per cubic centimeter. Some of the advantages of using two types of dopant ions such as arsenic or antimony and phosphorous are that the lateral buried layer impedance is low, a high collectorbase breakdown voltage is achieved on the order of 50–70 volts or greater, the P-film problem discussed above is eliminated, and a graded P-type isolation region is created as the boundary between buried layer 68 and second tub isolation region 66, as more fully discussed below in connection with FIG. 7.

Figure 5:
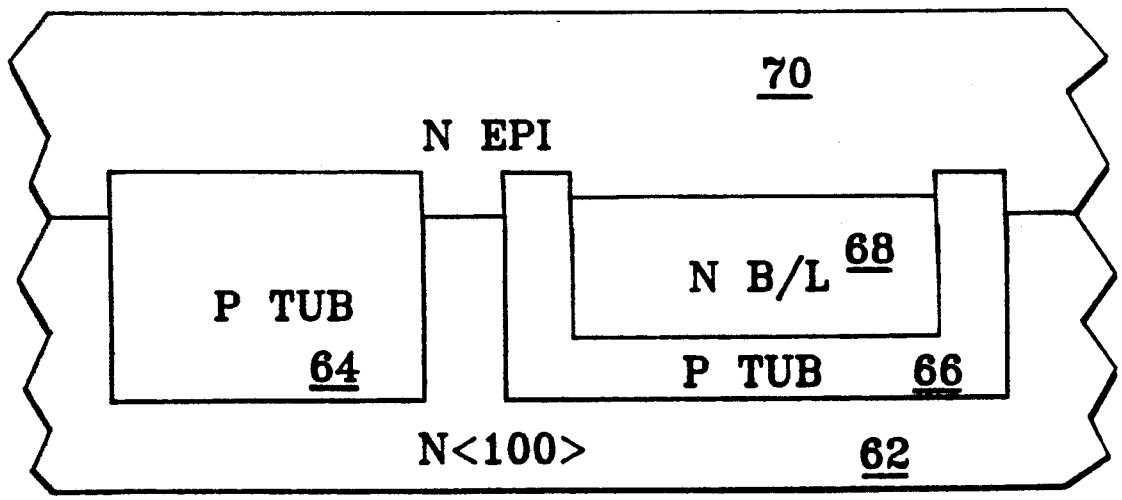
FIG. 5 is a sectional view of the structure of FIG. 4 at a later stage in the fabrication process, in which an epitaxial layer has been formed over the substrate, the buried layer, and the first and second tub isolation regions.

FIG. 5 depicts the next major fabrication step, in which an N epitaxial region 70 is grown over the entire wafer, namely substrate 62, first and second tub isolation regions 64 and 66, and buried layer 68. The thickness of the epitaxial layer is chosen depending upon the particular desired application, but typically varies from about 7-15 microns. The resistivity of epitaxial layer 70 is also chosen depending upon the desired application, but is generally in the range 1-5 ohm centimeters.

In the next stage of fabrication, depicted in FIG. 6, a mask step is used to define P− well regions 72, 76 and 78 in the upper surface of epitaxial layer 70. First P− well region 72 is located above first tub isolation region 64; second and third well regions 76 and 78 are located above second tub isolation region 66. As discussed below, the well regions are used to isolate the NPN transistors during the drive-in diffusion isolation step. First well region 72 also serves as the collector region for the PNP transistor.

The dopant concentration in P− well regions 72, 76 and 78 is much lighter than in conventional bipolar-type isolation diffusions. In the present invention, this dopant concentration is on the order of $10^{16}$ ions per cubic centimeter, whereas in conventional bipolar isolation diffusions the dopant concentration is on the order of $10^{18}$-$10^{19}$ ions per cubic centimeter. A conventional bipolar process requires a separate step to define the isolation regions that isolate each transistor from surrounding devices and to form the collector of PNP transistors. In the present invention, a common diffusion isolates the NPN transistors and forms the collector regions of the PNP Transistors. The concentration of this diffusion can be made the same as the P− well in a CMOS process, enabling complementary bipolar transistors to be fabricated simultaneously with standard CMOS devices.

The device is then heated for about 10 hours at about 1100°-1200° C. to create or drive-in the isolation regions, as shown in FIG. 7. During this thermal diffusion isolation step, dopant ions from first well region 72 diffuse downward, while dopant ions from first tub isolation region 64 diffuse upward. The result is the creation of a P− well isolation region 80 that forms the collector region of the PNP transistor.

Also during this drive-in step, dopant ions from second well region 76 diffuse downward while at the same time dopant ions from second tub isolation region 66 diffuse upward. The downwardly and upwardly diffusing dopant ions meet to create a vertical P− well isolation region 82. Similarly, downwardly diffusing ions from well region 78 meet upwardly diffusing dopant ions from second tub isolation region 66 to create a second vertical P− well isolation region 84. The spaced-apart vertical isolation regions 82 and 84 are used to isolate the NPN bipolar transistor from other devices.

Also during the thermal drive-in step, the dopant ions in buried layer 68 diffuse downwardly and laterally from buried layer 68 to partially counter-dope the nearby portions of second tub isolation region 66. This diffusion and counter-doping creates a graded P-type isolation region 86 at a boundary between buried layer 68 and second tub isolation region 66. Graded region 86 provides a suitable high breakdown voltage for buried layer 68.

The dopant ions in buried layer 68 having the higher rate of diffusion also diffuse upward during the same thermal drive-in step to counter-dope the portion of second tub isolation region 66 that would otherwise lie above buried layer 68. Thus, the silicon above buried layer 68 is converted to N-type, thereby avoiding the P-film problem discussed above.

FIG. 8 is a sectional view of the preferred embodiment of the complementary bipolar transistor structure according to the present invention. After the thermal drive-in step discussed above in connection with FIG. 7, conventional masking and ion implantation techniques are used to create an N base 90 and a P+ emitter 88 for the PNP transistor. Similarly, conventional techniques are used to form an N+ emitter 92, P+ base 94, N+ collector 96, P+ region 97 which serves as a guard ring, and P+ region 98 which enables contact to be made to P− well isolation regions 82 and 84. An oxide layer 99 having appropriate windows for metal contacts is then deposited over the entire structure. Conventional deposition or sputtering techniques are used to create metal emitter contact 100 for emitter 88, metal base contact 102 for base 90, metal collector contact 104 for collector/well region 74, metal emitter contact 106 for emitter 92, metal base contact 108 for base 94, metal collector contact 110 for collector 96, and metal contact 112 which is an electrical contact for well region 78. A means (not shown) for applying a negative potential to well region 78 via contact 112 keeps the NP junction diode negatively biased to prevent any significant current flow as done in conventional bipolar processes. Also, a source of positive supply potential applies a positive potential to substrate 62 to insure that the PNP transistor is self-isolating. As a final step, a protective insulation layer 114 is deposited over the entire structure to protect the device from environmental elements. The preferred embodiment uses the CMOS P channel drain/source diffusion as the PNP emitter material, and the CMOS N channel drain/source diffusion as the NPN emitter material, thus saving two fabrication steps. Further savings can be made by using P guard ring material, sometimes used on high voltage CMOS processes, as the base region of the NPN transistor.

Figure 9:
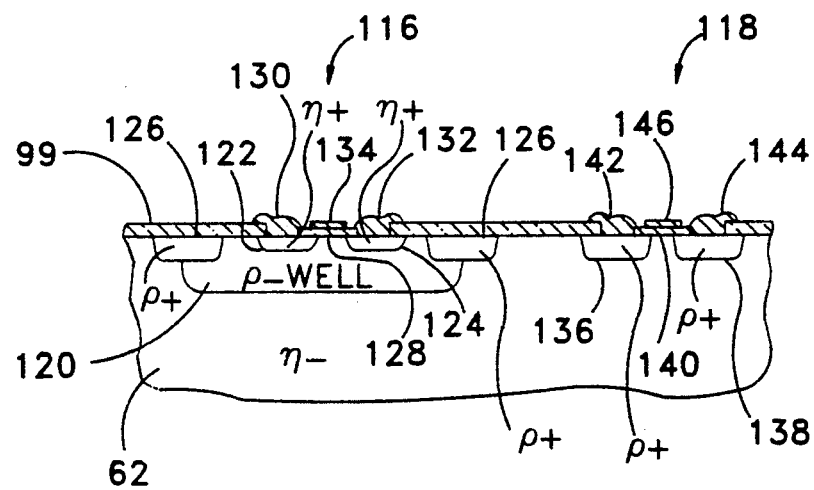
FIG. 9 is a section view of a continuation of the structure of FIG. 8, showing CMOS transistors fabricated on the same substrate as the bipolar transistors of FIG. 8.

FIG. 9 shows the CMOS portion of the preferred embodiment just referred to. It is formed on the same substrate 62 simultaneously with the fabrication of the complimentary bipolar transistors. The CMOS devices are themselves conventional, the novel aspect being their simultaneous fabrication in a compatible process with the bipolar transistors.

The illustrated CMOS devices include an n-channel MOSFET 116 and a p-channel MOSFET 118. The n-channel device is formed in a p-wall 120 within the n− substrate 62. As stated above, the concentration of the diffusion used to established the p-well 120 is preferably the same as that used for the collector regions of the npn bipolar transistors, thus enabling the p-well 120 to be formed simultaneously with the bipolar collectors. The diffusion can be performed in a conventional manner, either through gaseous diffusion or ion implantation. The n-channel device 116 also includes n+ source and drain regions 122 and 124, separated by a channel region. As stated above, these drain/source diffusions are the same as for the bipolar npn emitter, thus allowing the CMOS and bipolar elements to be fabricated simultaneously with the same diffusion step. Furthermore, a p+ guard region 126 that surrounds the n-channel device is preferably formed in the same diffusion as the base region of the npn bipolar transistor. The n-channel device is completed with a thin gate oxide insulating layer 128 above the channel, and respective source, drain and gate contacts 130, 132 and 134.

With the p-channel CMOS device 118, the p+ drain 136 and source 138 are formed in the same diffusion step as that used for the emitter of the pnp bipolar transistor. The channel region is formed by the n− substrate 62 itself, while a thin gas oxide layer 140 and respective drain, source and gate contacts 142, 144 and 146 are formed at the same time as the comparable elements on the n-channel device 116.

The n-channel p-well 120 is formed simultaneously with the pnp collector well 80 and with the npn isolation well 82/84 by simply using a common diffusion mask for all of these elements, which is the conventional way to establish simultaneous diffusions at different locations on an IC substrate. Similarly, the p-channel source 138 and drain 136 are formed simultaneously with the pnp emitter 88 by using a common diffusion mask for these elements, and the n-channel drain 122 and source 124 are formed simultaneously with the npn emitter 92 with the use of another common mask.

Although a particular preferred embodiment has been shown and described, it will be apparent to those skilled in the art that numerous modifications and alternate embodiments may be created and still be within the spirit and scope of the invention. Accordingly, it is intended that the invention be limited only by the following claims.

I claim:

1. A method of forming complementary PNP and NPN bipolar transistors simultaneously with complementary P-channel and N-channel metal oxide semiconductor (CMOS) transistors on a common substrate with an N-type epitaxial layer, comprising:

forming a first P-well for an N-channel MOS transistor, a second P-well for an NPN bipolar transistor and a collector well for a PNP bipolar transistor layer by a common diffusion of P-type dopant into said epitaxial layer, forming an N-base and a P-emitter within said collector well for the PNP bipolar transistor, forming a source and drain for said P-channel MOS transistor within said epitaxial layer in a common diffusion of P-type dopant with the emitter of said PNP bipolar transistor, forming a P-base, N-emitter and N-collector within said second P-well for said NPN bipolar transistor, said second P-well isolating said NPN bipolar transistor from other devices on said substrate, and forming a source and drain within said first P-well for said N-channel MOS transistor in a common diffusion of N-type dopant with the emitter of said NPN bipolar transistor.

2. The method of claim 1, wherein a P-type isolation barrier is formed in the epitaxial layer around the NPN bipolar transistor in a diffusion of P-type dopant which is common with said P-well and collector well diffusion.

3. The method of claim 1, wherein a guard ring for the N-channel MOS transistor and the base of the NPN bipolar transistor are formed by a common diffusion of P-type dopant; and the emitter of the NPN bipolar transistor is formed within the base of that transistor.

4. The method of claim 1, wherein the dopant concentration in the P-well and collector well are not more than about $10^{16}$ ions/cm$^3$.

* * * * *

UNITED STATES PATENT AND TRADEMARK OFFICE
CERTIFICATE OF CORRECTION

PATENT NO. : 5,262,345
DATED : November 16, 1993
INVENTOR(S) : Mohammad S. Nasser, Saurabh M. Desai, Derek F. Bowers It is certified that error appears in the above-indentified patent and that said Letters Patent is hereby corrected as shown below:

Title page, item [54] and col. 1, line 1,
In the Title, change "COMPLIMENTARY" to --COMPLEMENTARY--.

Signed and Sealed this

Ninth Day of August, 1994

Attest:

BRUCE LEHMAN

Attesting Officer    Commissioner of Patents and Trademarks